United States Patent
Parnaby et al.

(10) Patent No.: US 9,270,291 B1
(45) Date of Patent: Feb. 23, 2016

(54) HIGH SPEED TIME-INTERLEAVED ADC GAIN OFFSET AND SKEW MITIGATION

(71) Applicant: Broadcom Corporation, Irvine, CA (US)

(72) Inventors: Gavin D. Parnaby, Laguna Niguel, CA (US); Vasudevan Parthasarathy, Irvine, CA (US); John S. Wang, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/662,001

(22) Filed: Mar. 18, 2015

Related U.S. Application Data (60) Provisional application No. 62/102,838, filed on Jan. 13, 2015.

(51) Int. Cl.
| | |
|---|---|
| *H03M 1/12* | (2006.01) |
| *H03M 1/10* | (2006.01) |
| *H04B 17/21* | (2015.01) |
| *H04L 7/00* | (2006.01) |

(52) U.S. Cl.
CPC ............ *H03M 1/121* (2013.01); *H03M 1/1028* (2013.01); *H03M 1/1245* (2013.01); *H04B 17/21* (2015.01); *H04L 7/0004* (2013.01)

(58) Field of Classification Search
CPC ........................................ H03M 1/121–1/1245
See application file for complete search history.

(56) References Cited

U.S. PATENT DOCUMENTS

| | | | | |
|---|---|---|---|---|
| 7,245,638 B2* | 7/2007 | Agazzi | ................ | H03M 1/0624 370/516 |
| 7,551,114 B2* | 6/2009 | Joy | ........................ | H03M 1/002 341/122 |
| 8,902,094 B1* | 12/2014 | Zhang | .................... | H03L 7/0814 341/122 |
| 9,000,962 B1* | 4/2015 | Leuciuc | .............. | H03M 1/1033 341/120 |
| 2008/0069198 A1* | 3/2008 | Bhoja | .................... | H04L 7/0334 375/233 |

* cited by examiner

*Primary Examiner* — Howard Williams
(74) *Attorney, Agent, or Firm* — Fiala & Weaver P.L.L.C.

(57) ABSTRACT

Methods and apparatuses are described for timing skew mitigation in time-interleaved ADCs (TI-ADCs) that may be performed for any receive signal without any special signals during blind initialization, which may be followed by background calibration. The same gain/skew calibration metrics may be applied to baud sampled and oversampled systems, including wideband receivers and regardless of any modulation, by applying a timing or frequency offset to non-stationary sampled signals during initial training. Skew mitigation is low latency, low power, low area, noise tolerant and scalable. Digital estimation may be implemented with accumulators and multipliers while analog calibration may be implemented with adjustable delays. DC and gain offsets may be calibrated before skew calibration. The slope of the correlation function between adjacent samples may be used to move a timing skew estimate stochastically at a low adaptive rate until the skew algorithm converges.

20 Claims, 5 Drawing Sheets

HIGH SPEED TIME-INTERLEAVED ADC GAIN OFFSET AND SKEW MITIGATION

CROSS-REFERENCE TO RELATED APPLICATIONS

This application claims priority to U.S. Provisional Patent Application No. 62/102,838, filed Jan. 13, 2015, and entitled "High Speed Time-Interleaved ADC Gain Offset and Skew Mitigation," which is incorporated by reference herein in its entirety.

BACKGROUND

1. Technical Field

The subject matter described herein relates to the initialization and calibration of time-interleaved analog to digital converters (ADCs).

2. Description of Related Art

Time-interleaved ADCs (TI-ADCs) are used in very high speed communication systems, e.g., hundreds of Megasamples per second and beyond. A TI-ADC processes an input signal at a sampling rate Fs using N sub-ADCs, each operating on time-synchronized samples at a slower sampling rate of Fs/N. Outputs of the N sub-ADCs are interleaved to a cumulative output.

A significant problem with high speed TI-ADCs is mismatch among sample and hold (SH) circuits and sub-ADCs. Common causes of mismatches are component and trace length mismatches, which may result in resistive, capacitive, inductive and voltage mismatches. Mismatches are often quantified in terms of DC offset, gain offset and timing skew. Gain offset and timing skew may be quantified as bandwidth mismatch, where transfer function responses of SH circuits and ADCs are not the same across a frequency range.

Various techniques have been employed to mitigate timing skew, each of which has drawbacks. One technique requires a periodic or permanent training signal, which increases power requirements. Another technique requires foreground calibration, including a foreground calibration signal, extra hardware and a procedure that takes each SH circuit and ADC group offline for periodic calibration, resulting in link disruption, increased chip area, increased cost, increased power consumption and increased complexity. Another technique requires oversampling and an empty band in the sampled signal to estimate timing skew, which is incompatible with high speed transceivers without increased costs in terms of power and throughput. Another technique requires long finite impulse response (FIR) filters, which increases costs in terms of area and power consumption. Another technique requires parallel equalizers, which increases power consumption and requires knowledge of the received signal.

BRIEF SUMMARY

Methods and apparatuses are described for gain offset and timing skew mitigation in time-interleaved ADCs (TI-ADCs), substantially as shown in and/or described in connection with at least one of the figures, as set forth more completely in the claims.

BRIEF DESCRIPTION OF THE DRAWINGS/FIGURES

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies. However, embodiments are not limited to the specific implementations disclosed herein. Unless expressly indicated by common numbering, each figure represents a different embodiment where components and steps in each embodiment are intentionally numbered differently compared to potentially similar components in other embodiments. The left-most digit(s) of a reference number identifies the number of the figure in which the reference number first appears.

Exemplary embodiments will now be described with reference to the accompanying figures.

DETAILED DESCRIPTION

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example," or the like indicate that the subject matter described may include a particular feature, structure, characteristic, or step. However, other embodiments do not necessarily include the particular feature, structure, characteristic or step. Moreover, "embodiment," "example," or the like do not necessarily refer to the same embodiment. Further, when a particular feature, structure, characteristic or step is described in connection with an embodiment, it is submitted that it is within the knowledge of one skilled in the art to effect such feature, structure, or characteristic in connection with other embodiments whether or not those other embodiments are explicitly described.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection or through an indirect electrical connection via other devices and connections.

Embodiments of systems, devices and methods may be implemented in various architectures, each with various configurations. Several detailed features and embodiments are discussed below. Functionality may be referenced as logic, components, modules, circuits and the like. Functionality may be implemented in digital, analog or combined components. Functionality may be implemented in hardware, software or a combination thereof.

I. Introduction

Methods and apparatuses are described for gain offset and timing skew mitigation in time-interleaved ADCs (TI-ADCs) that may be performed for any receive signal (i.e. signal agnostic) without knowing channel or signal characteristics and without any special signals during blind initialization, which may be followed by background calibration during operation. Multi-stage skew mitigation may reduce static sources of misalignment caused by design and fabrication and dynamic sources of misalignment caused by operational variations (e.g. voltage, temperature). The same gain/skew calibration metrics may be applied to baud sampled and oversampled systems, including wideband receivers and regardless of any modulation and synchronous or asynchronous sampling, by applying, for example during initial training during blind initialization, a timing or frequency offset to non-stationary sampled signals. Non-stationary sampled signals are discrete time signals where correlation between adjacent samples is not constant across all adjacent SH pairings. Whether or not a signal is stationary depends on the statistic(s) being collected or observed, as opposed to whether an eye in an eye diagram appears stationary. The offset renders the sampled signal stationary over time given that the sample statistics average out across the baud. Skew mitigation is low latency, low power, low area, noise tolerant and scalable. Digital estimation may be implemented with accumulators and multipliers while analog calibration may be implemented with adjustable delays. DC and gain offsets may be calibrated before skew calibration. The slope of the correlation function between adjacent samples may be used to move a timing skew estimate stochastically at a low adaptive rate until the skew algorithm converges. Skew updates for ADCs coupled to the same SH may be accumulated and applied together.

In an embodiment, a device may comprise a receiver having a receiver clock frequency that receives a transmitted signal at a transmitted symbol frequency. The receiver comprises a plurality of sample and hold circuits (SHs), each with a set of time-interleaved analog to digital converters (TI-ADCs). A first SH provides samples of a sampled signal to a first set of TI-ADCs, a second SH provides samples of the sampled signal to a second set of TI-ADCs and so on. The number of SHs and TI-ADCs per SH may vary between implementations. The receiver may comprise a frequency offset component that applies a frequency offset. The frequency offset deliberately offsets the transmitted symbol frequency and the receiver clock frequency, which may make an otherwise non-stationary oversampled signal stationary over a symbol or baud. The stationary nature of a baud-sampled system and a non-stationary oversampled system rendered stationary by application of a frequency offset may permit use of the same gain and skew error calibration metrics applicable to a baud rate sampled system for an oversampled system.

In greater detail, an ideal baud rate sampled system produces stationary samples. Practical baud rate sampled systems produce non-stationary samples unless imperfections are corrected. Interaction of gain and skew imbalances make perfect correction difficult in a synchronized system. The application of a sampling frequency offset may render output samples stationary, reducing interaction and permitting compensation of imperfections. A rationally oversampled system may produce non-stationary samples, for example, when samples are taken from different sampling phases within a symbol. A sampling frequency offset may produce stationary output samples, permitting use of the same gain and skew error calibration metrics as in a baud rate sampled system. In other words, the sampling frequency offset may permit use of algorithms that rely on stationary samples that do not work with a rationally oversampled, frequency locked system.

A receiver may comprise DC offset, gain offset and skew calibration components for initialization and calibration. Initialization may be blind initialization and calibration may be background calibration. The frequency offset may be applied during the initialization and may not be applied during the background calibration. The gain calibration component may calibrate gain offset between the first and second SHs using samples taken by the first and second SHs during application of the frequency offset. The skew calibration component may calibrate skew between the first and second SHs using samples taken by the first and second SH during application of the frequency offset. Gain and skew may be calibrated using a low adaptive rate relative to the frequency offset, for example, so that gain and skew error metrics may be accumulated over an entire transmitted symbol or baud. Metrics may be averaged over a large number of samples. A sampling frequency offset, or offsets, may ensure that each sample has a different sampling phase. The sum metric may be an average over all sampling phases and may be constant for all SH. Gain and skew calibration may comprise digital estimation and analog compensation. Compensation may, for example, comprise programmable bias to compensate for gain/dc imperfections, timing recovery imperfections and/or bandwidth mismatches.

In an example embodiment, a method of initializing and calibrating DC offset, gain offset and skew in a receiver with sets of SHs and TI-ADCs comprises applying a frequency offset during initial receiver training. Gain offset and skew may be initially trained using samples taken by the first and second SH during application of the frequency offset. Frequency offset may be selected from among optional offsets. A method may comprise applying and measuring stationarity statistics for a plurality of offsets to select an offset that provides better stationarity of a sampled signal during training.

Following initial training, the frequency offset may be removed. Background calibration of gain and skew may be performed during operation of the receiver. Blind initialization may provide coarse gain offset and skew calibration of the receiver while background calibration may provide fine gain offset and skew calibration of the receiver with a smaller range of calibration than coarse calibration. For 2× oversampling with odd and even samples, background calibration may calibrate gain offset and skew separately for odd and even samples, calibrate gain offset and skew collectively as averages for odd and even samples, or calibrate gain offset and skew based on correlations between odd and even samples. The concept may be extended to any rational oversampling ratio (e.g. 3/2, 5/4).

Gain offset and skew, which may be calibrated sequentially or concurrently, may be calibrated using a low adaptive rate relative to the frequency offset so that gain and skew error metrics are accumulated over an entire transmitted symbol or baud. A slope of a skew correlation function may be used to move a timing skew estimate stochastically. A low adaptive rate may be applied to converge skew estimation until the slope is flat across all SHs. Phase error may be accumulated and applied collectively for each set of TI-ADCs provided samples by the same SH. A skew update may be calculated as a previous skew estimate less an adaptive rate multiplied by an estimated phase error given by a sample multiplied by a difference between a preceding sample and a succeeding sample.

II. Exemplary High Speed Time-Interleaved ADC Skew Mitigation

Figure 1:
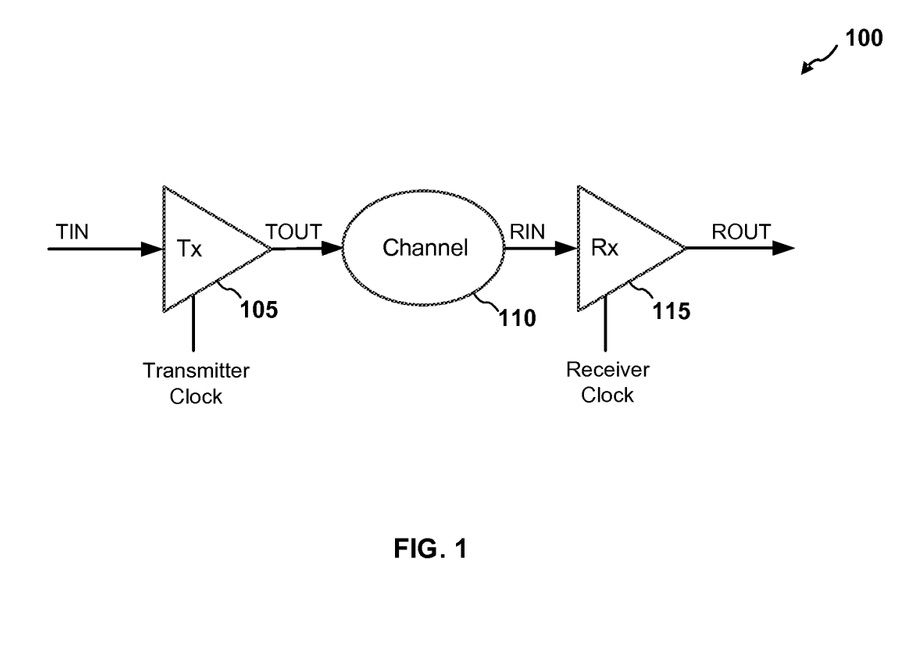
FIG. 1 shows a block diagram of an exemplary high speed communication system in which timing skew mitigation may be implemented.

FIG. 1 shows a block diagram of an exemplary high speed communication system 100 in which timing skew mitigation may be implemented. High speed communication system 100 comprises a transmitter (Tx) 105, a channel 110 and a receiver (Rx) 115. High speed communication system 100 may comprise, for example, an optical or mixed network system transmitting and receiving symbols at a rate of more than 10 gigasamples per second.

A source (not shown) provides information to transmitter 105. The information may be represented as symbols TIN. Transmitter 105 may generate a rectangular pulse per symbol, transmitting a sequence of pulses as TOUT at a transmitter clock frequency. Channel 110, which may be any high speed communication medium or media, conveys the symbols to receiver 115 as transmitted energy RIN. Energy from a single transmit symbol may be spread over multiple symbols by the time it reaches receiver 115. Receiver 115 estimates the transmitted symbol sequence by acquiring timing information and equalizing dispersed symbols. Receiver 115 generates a digital stream ROUT at a receiver clock frequency that recovers information transmitted by transmitter 105. Transmitter 105 may be part of a transceiver, e.g., an optical transceiver. Similarly, receiver 115 may be part of a transceiver, e.g., an optical transceiver. Channel 110 may be a channel in, for example, a fiber optic network, such as a 1 Tb/s ultra long haul (ULH) optical transmission network with many 10 Gb/s to 40 Gb/s optical channels coupled to dual polarization quadrature phase shift keying (DP QPSK) modulation coherent receivers.

Figure 2:
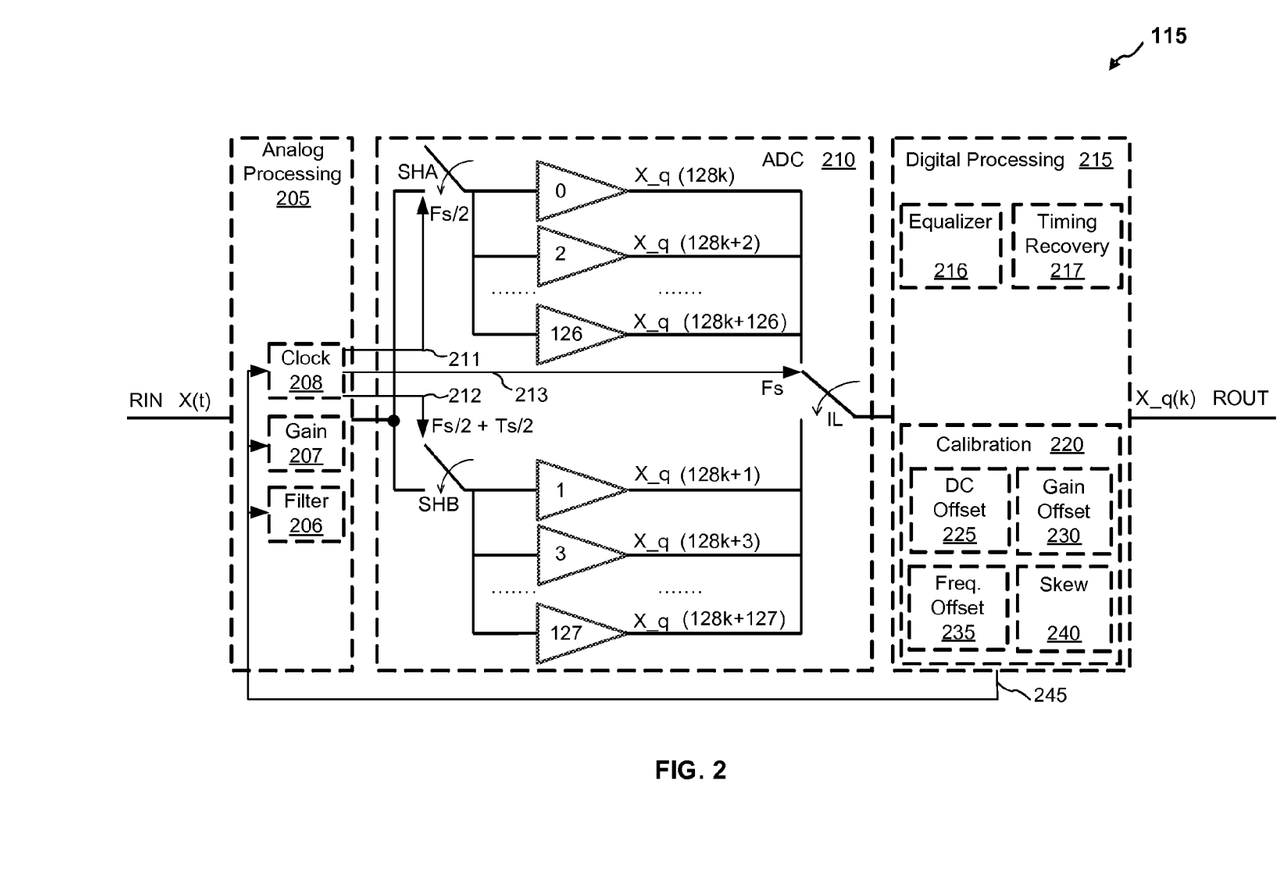
FIG. 2 shows a block diagram of an exemplary receiver in which timing skew mitigation may be implemented.

FIG. 2 shows a block diagram of an exemplary implementation of receiver 115 in which timing skew mitigation may be implemented. FIG. 2 is not intended to represent a specific architecture. Rather, FIG. 2 is intended to point out some receiver functionality used to recover a transmitted signal. As shown in FIG. 2, receiver 115 includes an analog processing component 205, an ADC 210 and a digital processing component 215. As an example of simplification in the block diagram of FIG. 2, in some implementations, each ADC 0-127 may have an internal SH driven by clock component 208. In other words, some implementations may have one level while other implementations may have multiple SH levels, e.g., a first SH level provided by first and second SHs SHA and SHB, which may be all or part of a number of SHs in a first SH level time-interleaved architecture, and a second SH level provided by SHs in each of ADCs 0-127.

Analog processing component 205 includes a filter component 206, a gain component 207 and a clock component 208. Analog processing component 205 conditions received signal RIN, a continuous time analog signal x(t), to enhance data recovery. For example, filter component 206 may comprise one or more filters that, for example, remove noise or reduce intersymbol interference. Gain component 207 may comprise one or more programmable gain operations that shape and/or boost receive signal RIN. Clock component 208 may comprise one or more clock generators. Clock component 208 generates sampling signals for sample and hold components SHA and SHB and for interleaving component IL. There are many options for implementation. As some examples, data could be interleaved to a single data stream, interleaved to any other bus width for digital processing or demultiplexed data streams may be transmitted without interleaving into a single data stream, e.g., by using a wide digital bus to carry demultiplexed ADC data, for example, depending upon power, latency or algorithmic complexity. As indicated by control signaling 245, filter component 206, gain component 207 and clock component 208 may be controlled by one or more components in digital processing component 215, e.g., filter component 206, gain component 207 and/or clock component 208 may be continuously and/or discretely controlled during initialization and background calibration.

ADC 210 converts an analog processed signal output by analog processing component 205 into samples at discrete times and levels. For example, ADC 210 may comprise an 8 bit, 10G Baud ADC that converts an analog signal to digital information at 10 billion samples per second. As illustrated in FIG. 2, this may be accomplished by many sub ADCs operating at slower clock frequencies, e.g., groups of sub-ADCs provided samples by the same SH, that are interleaved together for digital processing. As an example, for a sampling frequency Fs equal to 64 GHz, a number N of sub-ADCs, such as 128, may reduce the conversion frequency of each sub-ADC to Fs/N, e.g., 64 GHz/128 or 500 MHz.

As shown in FIGS. 1 and 2, in an example embodiment, device 100 comprises receiver 115 that receives input signal RIN, which is transmitted signal TOUT after traveling through communication channel 110, at a transmitted symbol frequency set by transmitter 105. Receiver 115 comprises a plurality of sample and holds SHA and SHB that provide samples to a respective set of TI-ADCs, i.e., ADC-0, 2, . . . 126 and ADC-1, 3, . . . 127. This two SH architecture is a simplified example. The number of SHs and TI-ADCs per SH and the number of levels of SH may vary between implementations.

ADC 210 includes two sample and hold components SHA and SHB that are each operated at Fs/2. Sample and hold components SHA, SHB collectively sample received signal x(t) at sampling frequency Fs. Clock component 208 generates SHA sampling frequency 211 and SHB sampling frequency 212. Although each of SHA and SHB operate at Fs/2, SHB is delayed by clock component 208, e.g., by Ts/2 where Ts/2 is the half the sampling period of receiver sampling frequency Fs. Delaying (shifting) sampling by SHB relative to SHA permits SHA and SHB to take alternating samples of analog input x(t). Each of SHA and SHB provides samples to 64 sub-TI-ADCs (a total of 128 sub-ADCs, each operating at Fs/128). This is but one example of an unlimited variety of other implementations of any number of sample and holds with any number of TI-ADCs. Another example may comprise, for example, four or eight SHs, each with 4, 8, 12, 16, 24, 32 or more sub-TI-ADCs.

SHA and SHB alternate (in a round robin fashion) in sampling and holding a sample X of input x(t) at a time k for quantization (q) at a particular level by one of 128 sub-ADCs. The 128 sub-ADCs in ADC 210 are numbered ADC-0 to ADC-127 in the order in which sub-ADCs ADC-0 to ADC-127 receive samples from SHA or SHB. Sub ADCs ADC0-127 convert samples 0 to 127 from the analog domain held by sample and holds SHA, SHB to a digital domain, e.g., strings or sequences of digital bits. Interleaving component IL interleaves digitally converted samples X_q (128k+0 to 127) together in order at the sampling frequency Fs of a sampling clock 213 provided by clock component 208. If ADC 210 is configured for oversampling, as opposed to baud rate sampling, then adjacent samples taken by SHA and SHB may represent oversampling. Oversampling may occur at any fractional or integer rate, e.g. 1.5×, 2×, 4×. Samples taken for 2× oversampling may be referred to as odd and even samples, which may or may not sample the same symbol.

Digital processing component 215 processes digitized output generated by ADC 210 to recover information transmitted by transmitter 105. Digital processing component 215 generates receiver output ROUT, comprising a digital stream X_q(k). Digital processing component 215 comprises, perhaps among other components, an equalizer component 216, a timing recovery component 217 and a calibration component 220. Equalizer component 216 may provide feed forward equalization, decision feedback equalization and maximum likelihood sequence estimation. Timing recovery component 217 may recover the symbol frequency of transmitted signal TOUT and recover the best sampling phase thereof. Other functions (not shown) in digital processing component 215 may include interference cancellation and error correction. Although shown in digital processing component 215 in the present example embodiment, calibration component 220 and sub-components therein may be configured in a variety of locations (e.g. within or outside of receiver 115 or a component therein, such as digital processing component 215, ADC 210 and analog processing component 205) and implemented in a variety of ways (e.g. analog or digital hardware, firmware, software or any combination thereof).

Error compensation components, including calibration components, may be useful or necessary, for example, because performance of ADC 210 is impacted by sampling frequency Fs, noise, distortion (nonlinear operation), integral nonlinearity (INL) and differential nonlinearity (DNL), DC offset, bandwidth response (including gain), jitter or timing skew or mismatch between SHs or sub-ADCs. Compensation algorithms in receiver 115 may compensate for some or all of these performance factors. For example, timing recovery component 217 recovers frequency and phase. Equalizer component 216 recovers gain variation over frequency and sampling phase. DC offset component 225 mitigates DC offset. Gain offset component 230 mitigates gain offset. Skew component 240 mitigates skew. While error estimation and response may be digital, error correction may be analog. For example, estimated skew offsets may be corrected by adjusting phases or frequencies in clock component 208 in analog processing component 205.

There is an added layer of difficulty with non-stationary sampled signals compared to stationary sampled signals. Stationary sampled signals (e.g., perfectly sampled baud rate signals without gain/skew/bandwidth imbalances) may simplify compensation logic. Sampled signals are stationary if the statistics of sampled signals are expected to be constant across all samples When a sampled signal that is expected to be stationary is not stationary, i.e., statistics are not the same, then it may be presumed that an imbalance occurred during conversion or due to another front end receiver component. Imbalance due to one or more causes may be detected, estimated and corrected. Compensation, correction or calibration logic, all used interchangeably, may return a sampled signal to stationary status, i.e., a sampled signal with stationary statistics.

An eye diagram may be used to visualize received signal RIN, which may include many superimposed analog signals offset by symbol period Ts. The signals may be periodic at a rate of symbol period Ts. Sampling at proper phases (e.g. near an open "eye") may be important in order to sample a symbol at a time when the signal representing the symbol dominates received energy. Sampling at incorrect phases, such as at the outskirts of an eye where multiple symbols may not be dominant, may make it difficult to accurately identify a symbol from a signal. In other words, sampling at incorrect phases reduces signal-to-noise ratio (SNR) performance of a receiver. Receivers with baud rate sampling or symbol rate sampling sample once per "eye" so that each sample has the same statistical properties and the sampled signal is stationary. However, noise and dispersive channel response may compress an "eye" vertically and horizontally. Equalization by equalizer component 216 may be used to separate energy from neighboring symbols to open the "eye," which may assist with proper sampling phase.

Receivers with oversampling ADCs may provide higher performance than baud-rate sampled ADCs, although oversampling may increase power consumption and necessitate faster ADCs. Oversampling receivers are less dependent on sampling phase. A signal may be recovered regardless of sampling phase, for example, using fractionally spaced equalizers in equalizer component 216. Oversampling ratios or factors may be any fractional or integer rate, e.g., 1.1×, 1.5×, 2×, 2.7×, 3×, 3.9×, 4× and so on. Oversampling may be beneficial in systems where phase varies at a high rate, e.g., fiber optic systems. A 2× oversampled receiver may take two samples per baud. SNR and BER may be roughly constant across sampling phase given that aliasing may be compensated by equalizer component 216. However, odd and even samples from oversampling ADCs would not be expected to be stationary given that they are not sampling at the same time in the baud and they produce multiple sets of sampling statistics. Oversampled signals may be cyclostationary, meaning statistics are expected to be the same at some periodic interval. Techniques disclosed herein work for any rational oversampling factor, e.g., 2×, 1.5×, 4/3× and so on. While an odd/even description references a 2× oversampled case, in other cases statistics would be cyclostationary with different periods compared to the 2× case. However, techniques, such as algorithms, may remain applicable.

Calibrating an oversampled (cyclostationary or nonstationary) signal is problematic for blind initialization, where no information may be known about a signal or channel. Blind estimation of gain offset and skew of an oversampled signal may not be accomplished using the same algorithms that work with baud rate sampled algorithms. Algorithms that work for baud rate sampled systems (i.e. baud rate compensation algorithms) may work with sets of samples expected to have common statistics (e.g. odd or even sets of 2× oversampling samples, but not both at the same time).

A continuous time correlation function may correlate samples, e.g. one at time t and another at time t+τ, using a correlation metric. The actual correlation depends on factors, such as signal characteristics, filtering, channel response, noise characteristics and mismatches. A correlation function may vary with sampling phase. For example, in a baud rate system, after sampling at a fixed sampling phase using a sampling clock fixed at the symbol frequency, correlation statistics should be constant if gain and skew imbalances are perfectly corrected. Then the sampled correlation function may be symmetric. Symmetry of a sampled correlation function provides that if adjacent samples are equally spaced in time then a sample multiplied by a succeeding sample should be equivalent to the sample multiplied by a preceding sample. A skew error may be given by the sample multiplied by the difference between the succeeding and preceding samples. The long term average of correlation may be biased towards an adjacent sample closer in time to a current sample by timing skew error. The skew error indicates which direction and magnitude to move skew compensation. A long term average of skew error calculations may provide an estimate of direction and magnitude. However, sample spaced correlation may not be applicable where oversampled samples do not have a symmetric correlation. To make matters worse, a skew correlation metric is very sensitive to residual gain imbalance and vice versa. The interaction between gain and skew make blindly compensating for gain offset and skew difficult. Signal energy may be used to estimate gain offsets. Signal energy may vary by sampling phase. Sampling phase may be biased, for example, because of the uncorrected timing skew. Uncorrected timing skew may limit the precision of gain correction, which in turn may limit the precision of timing skew estimation. Training disclosed herein may also improve training for baud-rate sampled systems.

A compensation technique for a time-interleaved system is needed to contend with gain/skew interaction and non-stationary sampling (e.g. cyclostationarity), preferably without any special training signals, without foreground calibration, without high power consumption and without complicated architecture.

As disclosed herein, gain offset and timing skew mitigation in time-interleaved ADCs (TI-ADCs) may be performed blind for any receive signal (i.e. signal agnostic) without knowing channel or signal characteristics and without any special training signals. Blind initialization may be followed by background calibration during operation to maintain calibrated operation. A multi-stage, multi-resolution skew mitigation may reduce static sources of misalignment caused by design and fabrication and dynamic sources of misalignment caused by operational variations (e.g. voltage, temperature).

The same gain/skew calibration metrics may be applied to baud sampled and oversampled systems, including wideband receivers regardless of any modulation and synchronous or asynchronous sampling. A non-stationary sampled signal may be rendered stationary during initial training (e.g. blind initialization) by applying a timing or frequency offset and averaging sample metrics across a baud over time.

Calibration component 220 of receiver 115 comprises a frequency offset component 235 that injects a frequency or timing offset to deliberately offset the transmitted symbol frequency and the receiver clock frequency Fs or the phase thereof. A frequency offset may be set in terms of parts per million (ppm) offset, e.g., 200 ppm offset. The frequency offset may be introduced during training, e.g., during initial training before a link is brought up. For example, clock component 208 may be controlled to introduce a frequency offset in receiver clock Fs, which introduces the frequency offset in the sampling clock(s) of receiver 115, e.g., SHA and SHB sampling clocks 211, 212. SHA and SHB with applied frequency offset during initial training may not sample at the same point within a symbol every time because the receiver sampling phase may continually drift across a symbol.

The frequency offset during initial training makes the averaged statistics of the sampled signal stationary over a plurality (e.g. many) cycles. Stationarity eliminates skew-gain interaction to simplify initial training. Over time, e.g. fractional or integer seconds, with samples taken by SHA and SHB at different phases across a symbol, the frequency offset may render an oversampled or otherwise nonstationary sampled signal stationary over a symbol or baud. Averaged statistics over time would be expected to be the same, i.e., stationary. This permits, for a nonstationary oversampled system, use of the same gain and skew error calibration metrics and compensation algorithms applicable to a stationary baud rate sampled system. Averaging sample statistics over time, the applied frequency offset permits distinction between codependent gain and skew so that gain offset may be isolated and calibrated distinctly from skew calibration during blind initialization.

Calibration may be multi-stage and may comprise, for example, blind initialization and background calibration. Frequency offset component 235 may apply frequency offset during initialization and may remove it for background calibration. Initial skew training may substantially or completely converge receive frequency Fs with the transmit frequency of the transmitter clock. Follow-up calibration during operation may fine tune calibration, e.g., converge receive frequency Fs with the transmit frequency of the transmitter clock.

Operation, in part or in whole, of one or more calibration components may be coordinated with operation of frequency offset component 235. In addition to frequency offset component 235, calibration component 220 also comprises a DC offset component 225, a gain offset component 230 and a skew component 240. One or more of these components may be simplified and permitted to operate during blind initialization due to frequency offset component 235.

DC offset component 225 mitigates DC energy by estimating and eliminating DC offset. DC offset component 225 may be viewed as a high pass filter with a low cutoff frequency in that it does not pass very low frequency energy such as DC energy. Link signals may be DC balanced, i.e., they may have zero DC energy, meaning that any detected DC energy may emanate from ADC mismatches and/or other undesirable sources. Removing DC energy may improve the dynamic range of sub-ADCs, improve algorithm performance by removing bias and generally improve performance, e.g., as indicated by effective number of bits (ENOB). DC offset may be estimated by a long term average. For example, DC offset may be calculated as the mean of the sum of sequential samples. DC offset due to operating conditions of time, temperature and voltage may be estimated using leaky average or LMS estimate. The long term average may be subtracted to eliminate DC offset.

Gain offset component 230 calibrates gain offset between SHA and SHB using samples taken by SHA and SHB and provided to TI-ADCs 0-127 during application of the frequency offset by frequency offset component 235. Gain offset component 230 may provide digital estimation and analog compensation as part of control signaling 245. Digital operation of gain offset component 230 may be accomplished by accumulators and multipliers. Gain compensation registers (not shown) may be used to set programmable gain compensation in the analog domain. Gain compensation registers may be initially trained during blind initialization and may be updated during background calibration.

Initial gain compensation training by gain offset component 230 occurs with a stationary sampled signal. Residual gain may be made arbitrarily small with sufficient averaging. Skew training by skew calibration component 240 may follow DC offset compensation and gain compensation. Residual skew may be made arbitrarily small. After initial training with the frequency offset, background training may be used to calibrate operation of receiver 115 during operation, which may have changes in temperature and voltage. Gain offset may be compensated by one or more signals in control signaling 245 provided to gain component 207 in analog processing component 205.

Skew calibration component 240 calibrates skew between SHA and SHB using samples taken by SHA and SHB and provided to TI-ADCs 0-127 during application of the frequency offset by frequency offset component 235. DC and gain offsets may be calibrated before skew calibration. The slope of the correlation function between adjacent samples may be used to move a timing skew estimate stochastically at a low adaptive rate until the skew algorithm converges. Skew estimation and compensation updates for ADCs coupled to the same SH may be accumulated and applied together. Skew calibration component 240 may provide digital estimation and analog compensation. Skew may be compensated for based on one or more signals in control signaling 245 provided to clock component 208 in analog processing component 205.

Digital estimation by skew component 240 may be implemented with accumulators and multipliers while analog calibration may be implemented with adjustable delays. Digital estimation may include additional bias registers, for example, to permit compensation of bandwidth mismatch, residual gain and dc mismatch, such as by adding offsets to the correlation metric for each SH. Skew compensation registers (not shown) may be used to set programmable skew compensation in the analog domain. Skew compensation registers may provide adjustable or programmable delays to SH clock edges (sample times). Skew compensation registers may be initially trained during blind initialization and may be updated during background calibration. Skew calibration may be implemented across SHs, ADCs or both.

As an example of skew calibration, a first level of programmable delays may comprise sixteen delay settings implemented for each sample and hold. Each delay setting may be offset by 300 fs. These programmable delays may be selected during initialization to eliminate the bulk of any timing skew, e.g. coarse correction. A second level of programmable delays may be selectable for fine skew correction. Steps in one or more levels of skew correction may be uniform or nonuniform. Skew correction in multiple levels may overlap.

Skew mitigation is low latency, low power, low area, noise tolerant and scalable. Gain and skew are trained during initialization using a slow adaptive rate relative to the frequency offset, such that the gain and skew error metrics accumulate over an entire symbol. Over time, each TI-ADC 0-127 sees samples from sample times uniformly distributed over a symbol. Sampling at all phases in a symbol averages out statistics for odd and even samples in a 2× oversampled system, creating a stationary signal. As a result, each TI-ADC 0-127 sees the same average sequence. The output samples across all TI-ADCs 0-127 and all SHs SHA-SHB are stationary. The same gain and skew compensation error metrics applicable to stationary baud-rate sampled systems may be applied to initialize an oversampled system. Baud rate may be high, e.g., greater than 10 GigaBaud). Training time may be a fraction of a second, fractional or integer number of seconds.

III. Exemplary Methods

Embodiments may also be implemented in processes or methods. Embodiments described with respect to FIGS. 1-2 and other embodiments in accordance with the technical subject matter described herein may operate according to methods presented herein.

Figure 3:
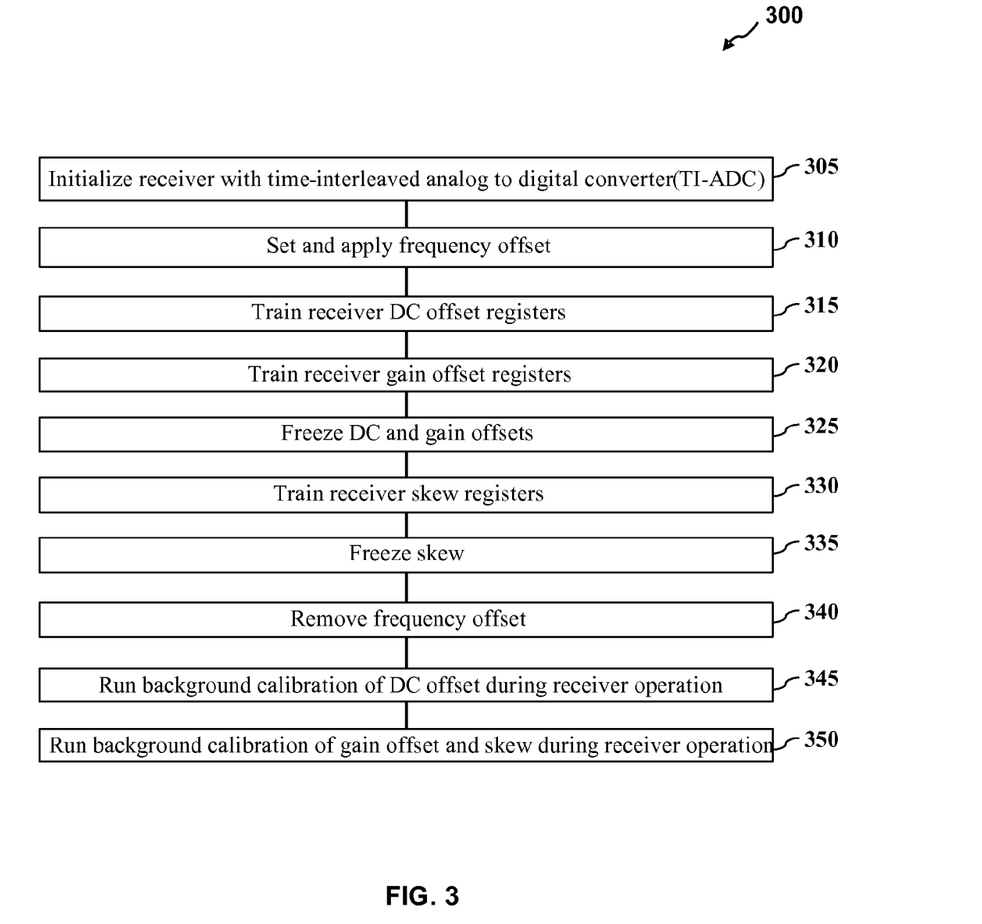
FIG. 3 shows a flowchart of an exemplary embodiment of timing skew mitigation.
Figure 4:
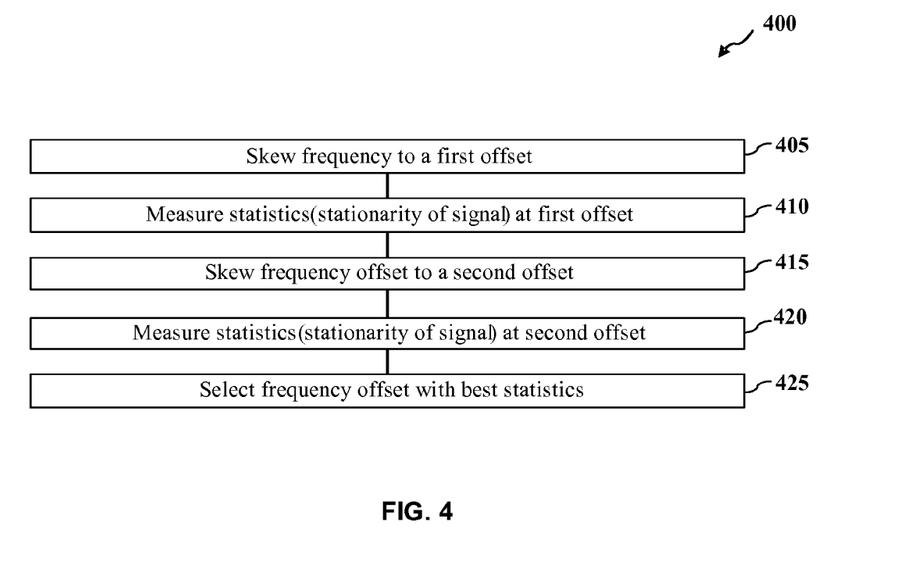
FIG. 4 shows a flowchart of an exemplary embodiment of timing skew mitigation.
Figure 5:
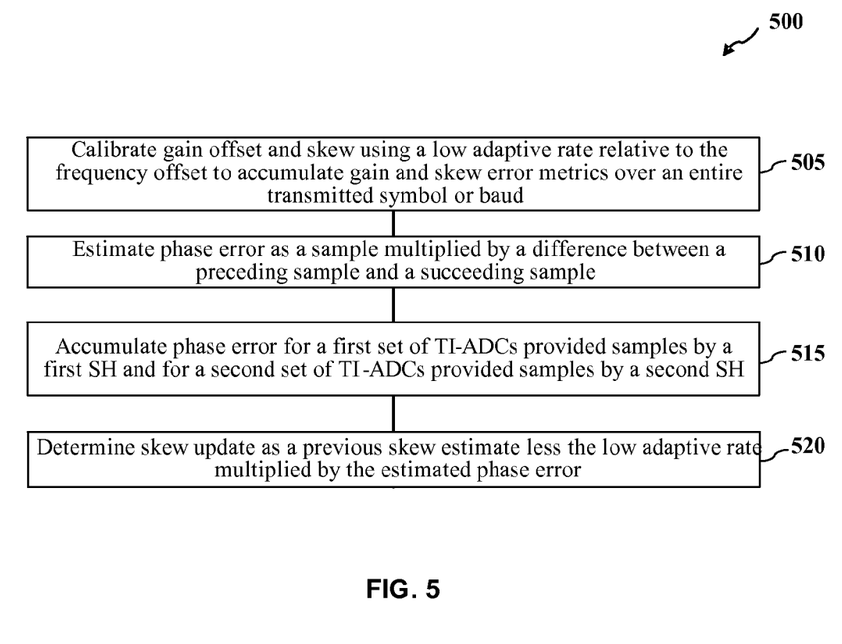
FIG. 5 shows a flowchart of an exemplary embodiment of estimating and compensating skew.

FIGS. 3-5 show flowcharts of exemplary embodiments of timing skew mitigation.

As shown in FIG. 3, method 300 presents one of many possible examples of high speed time-interleaved ADC skew mitigation. Method 300 begins when a receiver with a TI-ADC is initialized (305). Initialization may occur before a link is brought up during a system check to ensure properly functioning components. Such initialization may be implemented, for example, by receiver 115, shown in FIGS. 1 and 2.

A frequency offset is set and applied (310). For example, as discussed with respect to FIGS. 1 and 2, frequency offset component 235 sets a frequency offset, e.g., by applying a frequency offset to receiver clock Fs generated by clock component 208, which in turn offsets SHA and SHB sampling clocks 211, 212.

FIG. 4 shows an example method 400 of setting a frequency offset. Method 400 shows an example where several different offsets are tested to determine which one provides better sample statistics. Method 400 begins when a receiver frequency Fs is skewed to a first offset (405). For example, as discussed with respect to FIGS. 1 and 2, frequency offset component 235 applies the first frequency offset to receiver clock Fs generated by clock component 208, which in turn offsets SHA and SHB sampling clocks 211, 212. Application of the frequency offset deliberately offsets the transmitted symbol frequency and the receiver clock frequency to make the sampled signal stationary over time.

Statistics relating to the stationarity of the sampled signal are measured in response to application of the first offset (410). As an example, frequency offset component 235 measures statistics of the signal generated by ADC 210, e.g., using logic, such as a frequency offset selection algorithm.

Receiver frequency Fs is skewed to a second offset (415). For example, as discussed with respect to FIGS. 1 and 2, frequency offset component 235 applies the second frequency offset to receiver clock Fs generated by clock component 208, which in turn offsets SHA and SHB sampling clocks 211, 212.

Statistics relating to the stationarity of the sampled signal are measured in response to application of the second offset (420). As an example, frequency offset component 235 measures statistics of the signal generated by ADC 210, e.g., using logic, such as a frequency offset selection algorithm.

The frequency offset with the best stationarity statistics is selected from among the two or more frequency offsets tested (in this example first and second offsets) (425). As an example, frequency offset component 235 compares multiple sets of statistics of the signals generated by ADC 210 in response to the multiple offsets, e.g., using logic, such as a frequency offset selection algorithm. A frequency that results in stationary output samples may be selected and used during blind training.

Returning now to method 300 of FIG. 3, after selecting the frequency offset, e.g., the one with the best statistics according to method 400 in FIG. 4, the selected frequency is set and applied to deliberately offset the transmit and receive frequencies (310). As previously indicated, this may be accomplished in several ways. One way is for frequency offset component 235 to apply the selected offset to the receive frequency Fs generated by clock component 208.

After the selected frequency offset is set and applied, DC offset registers (not shown) in receiver 115 are trained to compensate for DC offset (315). For example, as shown in FIG. 2, DC offset component 225 may estimate and then compensate for estimated DC offset by specifying compensation in one or more registers (not shown) used for DC offset compensation. Compensation may be digital and/or analog.

Furthermore, gain offset registers (not shown) in receiver 115 are trained to compensate for gain offset (320). For example, as shown in FIG. 2, gain offset component 230 may estimate and then compensate for estimated gain offset by specifying compensation in one or more registers (not shown) used for gain compensation. Compensation may be digital and/or analog. As shown in FIG. 2, gain offset compensation may be communicated to gain component 207 in analog processing component 205 by one or more signals in control signaling 245. Calibration of gain offset between SHA and SHB may occur using samples taken by SHA and SHB during application of the frequency offset.

After training the DC offset registers and the gain offset registers, DC offset and gain offset compensation may be frozen before engaging in skew compensation. For example, as shown in FIG. 2, calibration component 220, or components therein such as DC offset component 225 and gain offset component 230, may freeze DC offset and gain offset compensation at the end of DC offset and gain offset training procedures.

Skew registers (not shown) in receiver 115 are then trained to compensate for skew (330). For example, as shown in FIG. 2, skew component 240 may estimate and then compensate for estimated skew by specifying compensation in one or more registers (not shown) used for skew compensation. Compensation may be digital and/or analog. As shown in FIG. 2, skew compensation may be communicated to clock component 208 in analog processing component 205 by one or more signals in control signaling 245. Calibration of skew between SHA and SHB may occur using samples taken by SHA and SHB during application of the frequency offset.

FIG. 5 shows an example method 500 of training gain offset registers (320) and training receiver skew registers (330). At the beginning of method 500, the gain offset and skew may be calibrated using a low adaptive rate relative to the frequency offset so that gain and skew error metrics are accumulated over many samples that use phases that may be uniformly distributed over an entire transmitted symbol or baud (505), for example, to provide stationary statistics. For example, as shown in FIG. 2, estimation algorithms in gain offset component 230 and skew component 240 may calibrate, respectively, using a low adaptive rate relative to the frequency offset so that gain and skew error metrics are accumulated over an entire transmitted symbol or baud. This may permit calibration, including blind calibration, of the gain offset and the skew by applying gain and skew error calibration metrics applicable to a baud rate sampled system.

Gain or skew calibration may be performed by using the slope of a gain or skew correlation function to move a gain offset or timing skew estimate stochastically. The low adaptive rate of the gain or skew correlation function may be applied to converge gain or skew estimation until the slope is flat across the first and second SHs.

After calibrating the gain offset and skew in the manner described above, phase error is estimated as a sample multiplied by a difference between a preceding sample and a succeeding sample (510). For example, as shown in FIG. 2, skew component 240 may calculate skew error as a sample multiplied by a difference between a preceding sample and a succeeding sample.

Phase error estimates may then be accumulated for TI-ADCs 0, 2 . . . 126 associated with SHA and phase error estimates may be accumulated for TI-ADCs 1, 3 . . . 127 associated with SHB (515). For example, as shown in FIG. 2, skew component 240 may accumulate phase error estimates for TI-ADCs 0, 2 . . . 126 associated with SHA and for TI-ADCs 1, 3 . . . 127 associated with SHB.

A skew update may then be determined (520) as a previous skew estimate less an adaptive rate multiplied by an estimated phase error given by a sample multiplied by a difference between a preceding sample and a succeeding sample. For example, as shown in FIG. 2, skew component 240 may determine a skew update as a previous skew estimate less an adaptive rate, e.g., a low adaptive rate, multiplied by an estimated phase error given by a sample multiplied by a difference between a preceding sample and a succeeding sample. The estimated phase error may be accumulated for a plurality of TI-ADCs associated with an SH for an aggregate skew update (515).

Returning to method 300, after the initial training of the skew registers (e.g. following blind initialization), skew compensation may be frozen (335). For example, as shown in FIG. 2, skew component 240 may freeze skew compensation following initial training Initial training may provide coarse training or multiple levels of training/calibration.

After freezing skew compensation, the frequency offset that was previously applied may be removed (340). For example, as shown in FIG. 2, frequency offset component 235 may remove frequency offset. Frequency offset may be removed, for example, before bringing a link online and proceeding to background training during operation of receiver 115. Removal of the frequency offset or ppm offset may lock the receiver frequency and/or phase to the link signal.

After removing the frequency offset, background calibration of DC offset may be performed during operation of receiver 115 (345). For example, as shown in FIG. 2, DC offset component 225 may perform background calibration during operation of receiver 115, having already performed initial training of DC offset registers. This multi-stage calibration of DC offset may compensate for errors due to static and dynamic causes.

As further shown in FIG. 3, background calibration of gain offset and skew may be performed during operation of receiver 115 (350). For example, as shown in FIG. 2, gain offset component 230 may perform background calibration of gain offset, having already performed initial training of gain offset registers. Similarly, skew component 240 may perform background calibration of skew during operation of receiver 115, having already performed initial training of skew compensation registers during initialization. This multi-stage calibration of gain offset and skew may compensate for errors due to static and dynamic causes. While initial training may perform coarse and/or fine calibration, background calibration during receiver 115 operation may perform fine and/or superfine calibration of receiver 115 operation, perhaps with a smaller range of calibration than coarse calibration. Background training may, for example, compensate for changes in operation due to temperature, voltage and other dynamic variables. Gain offset may be calibrated in parallel with or before skew calibration. The gain/skew adaptation may be re-enabled in background operation with or without constraints.

Receiver 115 may be configured for background calibration of oversampling (with odd and even samples). For example, gain offset component 230 and skew component 240 may be configured to calibrate gain offset and skew separately for odd and even samples. This may mean that the skew metric, instead of calculating error as a sample multiplied by the difference immediately adjacent samples, may calculate error as an even sample multiplied by the difference between the nearest preceding even sample and the nearest succeeding even sample. As another example, gain offset component 230 and skew component 240 may be configured to calibrate gain offset and skew collectively for odd and even samples as averages of gain offset and skew for the odd and even samples. This metric may take average gain/skew and force the average to be a constant. As another example, gain offset component 230 and skew component 240 may be configured to calibrate gain offset and skew for odd and even samples based on correlations between odd and even samples.

With regard to methodological examples provided in FIGS. 3-5, methods presented herein are presented without arrows to demonstrate that no order of operations is required unless expressly indicated or inherently required. Methods presented herein are only a few of many possible methodological embodiments. Other structural and operational embodiments will be apparent to persons skilled in the relevant art(s) based on the foregoing discussion of embodiments. There is no requirement that a method embodiment implement all of the operations illustrated or discussed. Embodiments may implement fewer, more or different operations with and without a particular order.

Methods, devices and systems disclosed herein permit blind calibration of skew between SH channels using the receive signal. It works when the signal is oversampled (whether synchronously sampled or asynchronously sampled) and when the signal is baud rate sampled with a fixed phase relationship with respect to the transmit signal. The stationary nature of the baud rate sampled signal may be used for skew adaptation. DC and gain offsets may be calibrated (removed) before skew adaptation takes place. Gain offsets may be removed by adapting all lanes to a common mean absolute level using a simple multiplier and accumulator loop.

Each sample and hold may be implemented with programmable delays on the sample time to permit adjustment/calibration to substantially eliminate timing skew. In an example, there may be sixteen delay settings implemented in a sample and hold, where each delay setting may be offset by, for example, 300 fs. There may be one or more levels of skew correction. A second level of fine skew correction may also be implemented with a smaller set size. Calibration steps may be uniformly spaced or nonuniformly spaced. Skew correction ranges in various stages of correction may overlap.

The slope of a correlation function may be used to move the timing skew estimate stochastically. With a sufficiently low adaptive rate, the algorithm will eventually converge, such that the correlation is flat across all SH, eliminating timing skew. For SH-index k, the skew update may be given by Eq. 1:

Skew_[SH_k at time t+1]=Skew_[SH_k at time t]-mu*Skew_error[SH_k+time t]  Eq. 1 where Skew_error [SH_k at time t] is given by Eq. 2:

Skew_error [SH_k at time t]=X[t*K+k]* (X[t*K+k-1]-X[t*K+k+1]),  Eq. 2 and k is the SH index, K is the number of SH, t is the time index and mu is an up shift, a down shift, a multiplier or other adjustment to change adaptation rate.

Skew estimation updates may be accumulated for ADCs provided with samples by the same SH. These aggregate estimation updates may be accumulated and applied together to the skew accumulator at a reduced digital clock rate. For example, for a 128 TI-ADC receiver with 16 SHs, a phase error update for eight ADCs fed by the first SH (SH0), i.e., samples 0, 16, 32, 48, 64, 80, 96 And 112 among 128 samples, may be calculated in accordance with Eq. 3:

PhaseError(0)=$S_{0,0}x(S_{-1,127}-S_{0,1})+S_{0,16}x(S_{0,15}-S_{0,17})+S_{0,32}x(S_{0,31}-S_{0,33})+S_{0,48}x(S_{0,31}-S_{0,33})+S_{0,64}x(S_{0,63}-S_{0,65})+S_{0,80}x(S_{0,79}-S_{0,81})+S_{0,96}x(S_{0,95}-S_{0,97})+S_{0,112}x(S_{0,111}-S_{0,113})$  Eq. 3 where S is a sample index, which is equivalent to x in Eq. 1 and, regarding Sx,y, y is the sample index within a block and x is the block index.

Referring to Eq. 3, PhaseError is the instantaneous skew error being accumulated by an adaptive loop and the S values are the ADC outputs after DC offset and gain offset correction. PhaseError is a cumulative or aggregate total of each of eight samples provided by SH0 multiplied by a difference between a respective preceding sample and a respective succeeding sample. This aggregate error may be accumulated in an LMS adaptive loop with a certain adaptive gain, mu. The accumulated error may be quantized and then used to set an analog deskew for the SH that feeds these ADCs (i.e. SH0). The number of independent loops may be, for example, N-1 or N independent loops.

A phase adjustment may be given by Eq. 4:

$$\text{Phase}_{adjust_i}[k+1] = \text{Phase}_{adjust_i}[k] + .\text{Error}_{i[t]}x. \underset{N\,bits}{\underbrace{}} \ll \underset{selected\,from\,range}{\underbrace{mu}}^{M\,bits} \quad \text{Eq. 4}$$

Referring to Eq. 4, I is the sample and hold index, k is digital clock index, N is the number of bits in the accumulator, M is the bit-width of maximum error metric and mu is an up shift, a down shift, a multiplier, etc. to change adaptation rate. A phase adjust register may be used to program analog deskew settings. For example, the upper 8 bits may be used to set 256 precision phase adjustment settings. Following convergence, delays have been trained such that delays between adjacent SHs are equal. An approach where estimation is implemented in the digital domain and correction takes place in the analog domain is very simple and power efficient.

The foregoing technique, among other techniques, may be extended for use with oversampled systems having any oversampling ratio or factor. Oversampled systems may be non-stationary or cyclo-stationary after the receiver is trained because even and odd SH, or any number of SHs in oversampling ratios other than two, may see different signals, meaning the correlation between them is not symmetric across all SH adjacent-pairings. As indicated, this is resolved by introducing a frequency offset during initial training With a frequency offset, the sampled received signal becomes stationary. Then the foregoing technique, among others, may be used to train the initial skew registers and other circuits if necessary, e.g., gain offset, bandwidth mismatch. By introducing a frequency offset, the sampled signal becomes stationary and it can be used to calibrate out front end differences between channels. After initial calibration is achieved, the frequency offset may be relaxed or released and the receiver may be fully enabled with symbol synchronization with correlation between next-but-one neighbors to adapt the delays.

One SH may be "frozen" to serve as a reference while the other SHs find their optimal skew settings around the fixed SH delay. Freezing an SH may permit the adaptation to settle down without SH delays moving relative to each other. More than one SH may be frozen during data mode, for example, in a synchronous oversampled system. Bandwidth mismatch between SHs and ADCs may also be calibrated, e.g., by adapting filters, such as by freezing one lane filter, allowing other lanes to adapt to match the statistics of the frozen lane.

There are many advantages to the disclosed methods, devices and systems. Disclosed techniques do not require any special link signal, do not require any special signal format and do not require any special training signal, which improves dynamic range, reduces power consumption, reduces hardware and increases throughput. Calibration may be signal agnostic, without any need to know the channel characteristics or the transmit or receive signal characteristics. Calibration works even when signal characteristics are unknown.

Digital estimation and analog compensation provide low power requirements. Training may provide a flat power profile, without power spikes. Digital operation may be implemented with low power accumulators and multipliers for estimation, without complicated, power hungry, high latency filtering or correction circuitry. Analog operation may be implemented simplistically with adjustable delays on SH clock edges, without high power requirements or complicated implementation.

The techniques are flexible because they do not rely on special signaling, are noise tolerant and operate on baud rate and oversampled systems regardless of modulation. Training is noise tolerant. Noise is averaged out since training is based on statistics instead of one-shot estimation. Training may be relatively fast with low to no latency correction, which is valuable for high speed data-center transceivers. Background training may be performed without any need for signal generation, without over-built ADCs for offline estimation, without SNR reduction and without offline calibration. Training may be implemented with or without firmware, which may be implemented as simple control. Training may correct skew/gain without relying on other receiver training Signal differentiation is not required. Training is highly scalable, i.e., easily extended to a wide variety of interleaving factors (ADC or SH), such as where the number of SH, number of ADC or ration of ADC per SH varies. Skew correction ranges, number of steps and step size or increments may vary widely with little effect on power consumption. The tracking algorithm may be simple, low power, operating in the background, with no effect on the datapath.

The techniques herein also resolve gain/skew interaction, which can be used to improve baud rate and oversampled system performance. Using sampling frequency offset, gain and skew can be estimated independent of each other because the offset results in long term signal statistics being constant regardless of sampling phase. The frequency offset enables use of simpler baud-rate sampled system metrics during blind initialization. As a result, high fidelity compensation is possible with baud rate and oversampled receivers.

The techniques are robust. Techniques are valid for baud-rate sampled signals and/or oversampled signals (synchronous or asynchronous) e.g. in BASE-T or SERDES transceivers. Techniques are also applicable to wideband architectures, e.g., digital RF (WiFi, cellular or wireless backhaul) or wideband cable ADCs. Techniques are applicable to signals that are synchronized (e.g. baud rate sampling or oversampled synchronous systems) or signals that are asynchronously sampled. Techniques may be applied regardless of modulation scheme, e.g., baseband, passband, PAM, QAM, CAP, OFDM, DMT etc. Techniques are applicable if signal composition changes (e.g. when a narrowband interferer appears/disappears or, in a wideband cable architecture, a MOCA signal may not be static because it is TDMA).

Techniques disclosed herein may be expanded and/or varied to provide supplemental, different and/or robust solutions. The techniques, e.g., algorithms, may be used to calibrate skews across ADCs, in addition to or alternate to calibrate skews between SHs. ADC-level skews may be secondary skews, referring to skews between SHs as primary skews.

Techniques may be used, e.g., adapted, for gain correction and bandwidth mismatch correction. In some cases, bandwidth mismatch between SH/ADC may be significant. Techniques, such as offsetting the receive signal, may allow bandwidth mismatch to be corrected using the stationary nature of the sampled process to adapt filters e.g. freeze one lane filter, allow the other lanes to adapt to match the statistics of the first lane.

Another variation of techniques, e.g., algorithms, is the use of "zero-crossing" information to adapt skews. This may be interpreted as a quantized version of the correlation algorithm. With this variation, the skew error metric may be given by $d\_x1=Z01-Z12$, where $d\_x1$ is the skew accumulator register for sample and hold 1. Z01 may be 1 when the data from SH0 and SH1 have different signs and 0 when the data from SH0 and SH1 have the same sign. Z12 may be 1 when the data from SH1 and SH2 have different signs and 0 when the data from SH1 and SH2 have the same sign. In some circumstances, a zero crossing approach may be more tolerant to gain imbalance.

IV. Conclusion

While various embodiments have been described above, it should be understood that they have been presented by way of example only, and not limitation. It will be understood by those skilled in the relevant art(s) that various changes in form and details may be made to such embodiments without departing from the spirit and scope of the subject matter of the present application.

Methods and apparatuses have been described for timing skew mitigation in TI-ADCs that may be performed for any receive signal (i.e. signal agnostic) without knowing channel or signal characteristics and without any special signals during blind initialization, which may be followed by background calibration during operation. Multi-stage skew mitigation may reduce static sources of misalignment caused by design and fabrication and dynamic sources of misalignment caused by operational variations (e.g. voltage, temperature). The same gain/skew calibration metrics may be applied to baud sampled and oversampled systems, including wideband receivers and regardless of any modulation and synchronous or asynchronous sampling, by applying, for example during initial training during blind initialization, a timing or frequency offset to non-stationary sampled signals (where correlation between adjacent samples is not symmetric across all adjacent SH pairings). The offset renders the sampled signal stationary over time given that the samples average out across the baud. Skew mitigation is low latency, low power, low area, noise tolerant and scalable. Digital estimation may be implemented with accumulators and multipliers while analog calibration may be implemented with adjustable delays. DC and gain offsets may be calibrated before skew calibration. The slope of the correlation function between adjacent samples may be used to move a timing skew estimate stochastically at a low adaptive rate until the skew algorithm converges. Skew updates for ADCs coupled to the same SH may be accumulated and applied together.

Implementation of any one of many embodiments may improve timing synchronization, resulting in improved performance, e.g., as indicated by spurious free dynamic range (SFDR), signal to noise and distortion ratio (SNDR) and the effective number of bits (ENOB).

Embodiments are not limited to the functional blocks, detailed examples, steps, order or the entirety of subject matter presented in the figures, which is why the figures are referred to as exemplary embodiments. A device, apparatus or machine may comprise any one or more features described herein in any configuration. A method may comprise any process described herein, in any order, using any modality.

There are no limitations on application of embodiments. For example, without limitation, embodiments may be used, for example, in present and future multi-mode fiber, backup plane, chip-2-chip and wireless transceivers, enterprise networking receiver solutions, optical and hard disk drive applications and any other timing synchronization applications.

A device (i.e. apparatus), as defined herein, is a machine or manufacture as defined by 35 U.S.C. §101. Devices may be digital, analog or a combination thereof. Devices may be implemented with any semiconductor process or semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such alternative devices may require alternative configurations other than the configuration illustrated in embodiments presented herein.

Techniques, including methods, described herein may be implemented by hardware (digital and/or analog) or a combination of hardware and software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While a limited number of embodiments have been described, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the disclosed technologies. The exemplary appended claims encompass embodiments and features described herein, modifications and variations thereto as well as additional embodiments and features that fall within the true spirit and scope of the disclosed technologies. Thus, the breadth and scope of the disclosed technologies should not be limited by any of the above-described exemplary embodiments, but should be defined only in accordance with the following claims and their equivalents.

What is claimed is:

1. A device, comprising:
a receiver that receives a transmitted signal at a transmitted symbol frequency, the receiver having a receiver clock frequency, the receiver comprising:
  a first sample and hold (SH) that provides samples of a sampled signal to a first set of time-interleaved analog to digital converters (TI-ADCs);
  a second SH that provides samples of the sampled signal to a second set of TI-ADCs;
  a frequency offset component that applies a frequency offset that deliberately offsets the transmitted symbol frequency and the receiver clock frequency to make the sampled signal stationary;
  a gain calibration component that calibrates gain offset between the first and second SHs using samples taken by the first and second SH during the application of the frequency offset; and
  a skew calibration component that calibrates skew between the first and second SHs using samples taken by the first and second SH during the application of the frequency offset.

2. The device of claim 1, wherein the gain offset and skew are calibrated using a low adaptive rate relative to the frequency offset so that gain and skew error metrics are accumulated over an entire transmitted symbol or baud.

3. The device of claim 1, wherein the gain and skew calibration components respectively apply gain and skew error calibration metrics applicable to a baud rate sampled system.

4. The device of claim 1, wherein the calibration performed by the gain and skew calibration components using the frequency offset provides blind initialization for the receiver.

5. The device of claim 4, wherein the gain and skew calibration components further provide background calibration without the frequency offset during operation of the receiver.

6. The device of claim 1, wherein the calibration performed by the gain and skew calibration components comprises digital estimation and analog compensation.

7. A method for gain offset and skew mitigation in a receiver that receives a transmitted signal at a transmitted symbol frequency, the receiver having a receiver clock frequency and comprising a first sample and hold (SH) that provides samples of a sampled signal to a first set of time-interleaved analog to digital converters (TI-ADCs) and a second SH that provides samples of the sampled signal to a second set of TI-ADCs, the method comprising:
applying a frequency offset that deliberately offsets the transmitted symbol frequency and the receiver clock frequency to make the sampled signal stationary;
calibrating gain offset between the first and second SHs using samples taken by the first and second SH during application of the frequency offset; and
calibrating skew between the first and second SHs using samples taken by the first and second SH during application of the frequency offset.

8. The method of claim 7, wherein the calibrating of the gain offset and the skew comprises:
calibrating the gain offset and the skew using a low adaptive rate relative to the frequency offset so that gain and skew error metrics are accumulated over an entire transmitted symbol or baud.

9. The method of claim 7, the receiver being an oversampled system, wherein the calibrating of the gain offset and the skew comprises:
calibrating the gain offset and the skew by applying gain and skew error calibration metrics applicable to a baud rate sampled system.

10. The method of claim 7, wherein the calibrating of the gain offset and skew using the frequency offset occurs during blind initialization of the receiver.

11. The method of claim 10, further comprising:
removing the frequency offset for background calibration; and
performing background calibration of gain and skew during operation of the receiver after the blind initialization.

12. The method of claim 11, wherein the blind initialization performs coarse gain offset and skew calibration of the receiver and the background calibration performs fine gain offset and skew calibration of the receiver with a smaller range of calibration than the coarse gain offset and skew calibration.

13. The method of claim 11, further comprising:
performing, when the receiver causes the first and second SHs to oversample the transmitted signal with first and second samples, one of the following for background calibration of the first and second samples:
calibrating gain offset and skew separately for first and second samples;
calibrating gain offset and skew collectively for first and second samples as averages of gain offset and skew for the first and second samples; and
calibrating gain offset and skew for first and second samples based on correlations between first and second samples.

14. The method of claim 7, wherein the calibrating of the gain offset and skew comprises:
digitally estimating gain offset and skew; and
providing analog compensation of gain offset and skew.

15. The method of claim 7, further comprising:
applying a first test frequency offset;
measuring statistics of the first frequency offset to determine a first stationarity of the sampled signal based on application of the first test frequency offset;
applying a second test frequency offset;
measuring statistics of the second frequency offset to determine a second stationarity of the sampled signal based on application of the second test frequency offset; and
selecting as the frequency offset one of the first and second test frequency offsets based on whether the determined first stationarity or the determined second stationarity providing better stationarity.

16. The method of claim 7, wherein the calibrating of the gain offset is performed before or in parallel with the calibrating of the skew.

17. The method of claim 7, wherein the calibrating of the skew comprises:
using a slope of a skew correlation function to move a timing skew estimate stochastically.

18. The method of claim 17, wherein the calibrating of the skew further comprises:
applying a low adaptive rate relative to the frequency offset to converge skew estimation until the slope is flat across the first and second SHs.

19. The method of claim 18, wherein the calibrating of the skew further comprises:
determining a skew update as a previous skew estimate less an adaptive rate multiplied by an estimated phase error given by a sample multiplied by a difference between a preceding sample and a succeeding sample.

20. The method of claim 19, further comprising:
applying a programmable bias to compensate for gain imperfections, dc offset imperfections, timing recovery imperfections and/or bandwidth mismatches.

* * * * *